(12) United States Patent
Chang et al.

(10) Patent No.: US 8,320,211 B1
(45) Date of Patent: Nov. 27, 2012

(54) CURRENT-SENSE AMPLIFIER WITH LOW-OFFSET ADJUSTMENT AND METHOD OF LOW-OFFSET ADJUSTMENT THEREOF

(75) Inventors: Meng-Fan Chang, Hsinchu (TW); Yu-Fan Lin, Hsinchu (TW); Shin-Jang Shen, Hsinchu (TW); Yu-Der Chih, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 87 days.

(21) Appl. No.: 13/108,550

(22) Filed: May 16, 2011

(51) Int. Cl.
 *G11C 7/06* (2006.01)
 *H03F 3/16* (2006.01)
(52) U.S. Cl. ............... 365/210.11; 365/210.1; 365/208; 365/205; 365/202; 365/203; 365/189.15; 365/189.05; 327/55; 327/56; 327/57
(58) Field of Classification Search ............ 365/210.11, 365/210.12, 210.1, 208, 207, 205, 202, 203, 365/189.15, 189.05; 327/52, 55, 56, 57, 327/51
See application file for complete search history.

(56) References Cited

U.S. PATENT DOCUMENTS

| 5,034,923 | A * | 7/1991 | Kuo et al. ............... 365/189.16 |
| 8,023,335 | B2 * | 9/2011 | Kang ....................... 365/185.25 |
| 8,072,244 | B1 * | 12/2011 | Liu et al. ......................... 327/51 |
| 2007/0024325 | A1 * | 2/2007 | Chen ................................. 327/55 |

OTHER PUBLICATIONS

"An Automatic Offset Compensation Scheme with Ping-Pong Control for CMOS Operational Amplifier"; Chong-Gun Yu and Randall L. Geiger; IEEE Journal of Solid-State Circuits, vol. 29, No. 5, May 1994.

* cited by examiner

*Primary Examiner* — Andrew Q Tran
(74) *Attorney, Agent, or Firm* — Wang Law Firm, Inc.; Li K. Wang; Stephen Hsu

(57) ABSTRACT

A current-sense amplifier with low-offset adjustment and a low-offset adjustment method thereof are disclosed. The current-sense amplifier includes a sensing unit, an equalizing unit and a bias compensation unit. The sensing unit includes a sense amplifier, a latch circuit, a first precharged bit line, and a second precharged bit line. The equalizing unit is electrically connected to the first and the second precharged bit line for regulating a voltage of the first precharged bit line and a voltage of the second precharged bit line to the same electric potential. The bias compensation unit is electrically connected to the sense amplifier for compensating an input offset voltage of the current-sense amplifier.

15 Claims, 5 Drawing Sheets

CURRENT-SENSE AMPLIFIER WITH LOW-OFFSET ADJUSTMENT AND METHOD OF LOW-OFFSET ADJUSTMENT THEREOF

FIELD OF THE INVENTION

The present invention relates to a current-sense amplifier, and more particularly to a current-sense amplifier with low-offset adjustment and a low-offset adjustment method thereof for compensating an input offset voltage of the current-sense amplifier and increasing the data read speed and accuracy of a flash memory.

BACKGROUND OF THE INVENTION

Non-volatile memory has been widely applied in memory cards and USB flash drives. Since consumers demand for memory having higher access speed and accuracy but lower power consumption, it has now become an important issue as how to develop a memory with increased data access speed and accuracy to satisfy the market demands. Presently, in most cases, electronic engineers try to obtain increased memory access speed and accuracy by reducing the offset voltage of a current-sense amplifier for the memory. The offset voltage would adversely affect the quality of a circuit system. In a current-sense amplifier for memory, an input offset voltage thereof would cause unstable current detection accuracy to thereby reduce the memory data read speed and accordingly, result in incorrect data reading. In conventional solutions, the offset voltage of the current-sense amplifier is compensated in order to obtain increased current detection accuracy.

FIG. 1 is a circuit diagram of a conventional automatic offset compensation scheme with ping-pong control for complementary metal-oxide-semiconductor (CMOS) operational amplifier (data source: IEEE Journal of Solid-state Circuits, Vol. 29, No. 5, May 1994). As shown, the amplifier is electrically connected to a compensation circuit, which includes a current mirror and an adjustable transistor. The adjustable transistor controls the current gain of the current mirror, so as to adjust the offset compensation voltage. In the conventional automatic offset compensation scheme shown in FIG. 1, a control voltage VC is input to a gate of the adjustable transistor to control the working property of the adjustable transistor and accordingly, affect the current gain of the current mirror. The control voltage VC is obtained by converting an output voltage of the amplifier using a digital-to-analog converter (DAC). A computing circuit analyzes the effect of a previous offset compensation, in order to adjust the next compensation voltage. Thus, the control voltage VC is not a fixed voltage.

The conventional offset compensation circuit is mainly composed of transistors and capacitors, and feeds back the output voltage of the amplifier to compensate the offset voltage of the current-sense amplifier. However, due to the amplifier's circuit structure, the compensation effect is adversely affected and fails to achieve ideal compensation, which in turn hinders the memory from providing increased data read speed and accuracy. It is therefore tried by the inventor to work out a way for effectively reducing the input offset voltage of the current-sense amplifier in order to enable increased memory data access speed and accuracy.

SUMMARY OF THE INVENTION

A primary object of the present invention is to provide a current-sense amplifier with low-offset adjustment and a low-offset adjustment method thereof, so as to overcome the problem of slow memory data read speed due to reduced current detection accuracy caused by the offset voltage of the current-sense amplifier for the memory.

To achieve the above and other objects, the current-sense amplifier with low-offset adjustment according to the present invention includes a sensing unit, an equalizing unit and a bias compensation unit. The sensing unit has a sense amplifier, a latch circuit, a first precharged bit line, and a second precharged bit line. The equalizing unit is electrically connected to the first and the second precharged bit line for regulating a voltage of the first precharged bit line and a voltage of the second precharged bit line to the same electric potential, so as to reduce an input offset voltage of the current-sense amplifier and accordingly enable increased memory data read speed. The bias compensation unit is electrically connected to the sense amplifier for compensating an offset voltage of the current-sense amplifier, so as to enable increased current detection accuracy and memory data read accuracy.

To achieve the above and other objects, the low-offset adjustment method according to the present invention is applicable to the compensation of an offset voltage of a current-sense amplifier. The current-sense amplifier includes a sensing unit, an equalizing unit, and a bias compensation unit; and the sensing unit further includes a sense amplifier, a latch circuit, a first precharged bit line, and a second precharged bit line. The low-offset adjustment method includes the following steps: the equalizing unit regulates a voltage of the first precharged bit line and a voltage of the second precharged bit line to the same electric potential, so as to reduce the clock-skew sensitivity of the current-sense amplifier; and the bias compensation unit outputs a compensation voltage to the sense amplifier for compensating an offset voltage of the current-sense amplifier.

According to the above description, the current-sense amplifier with low-offset adjustment and the low-offset adjustment method thereof according to the present invention provide one or more of the following advantages:

(1) By using the equalizing unit to regulate the voltages of the first and the second precharged bit line to the same electric potential, it is possible to reduce the clock-skew sensitivity of the current-sense amplifier;

(2) By using the equalizing unit to regulate the voltages of the first and the second precharged bit line to the same potential, it is possible to reduce the clock-skew sensitivity of the current-sense amplifier and accordingly, enable increased memory data read speed.

(3) By using the bias compensation unit to supply the compensation voltage to the current-sense amplifier, it is possible to increase the current detection accuracy of the current-sense amplifier.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
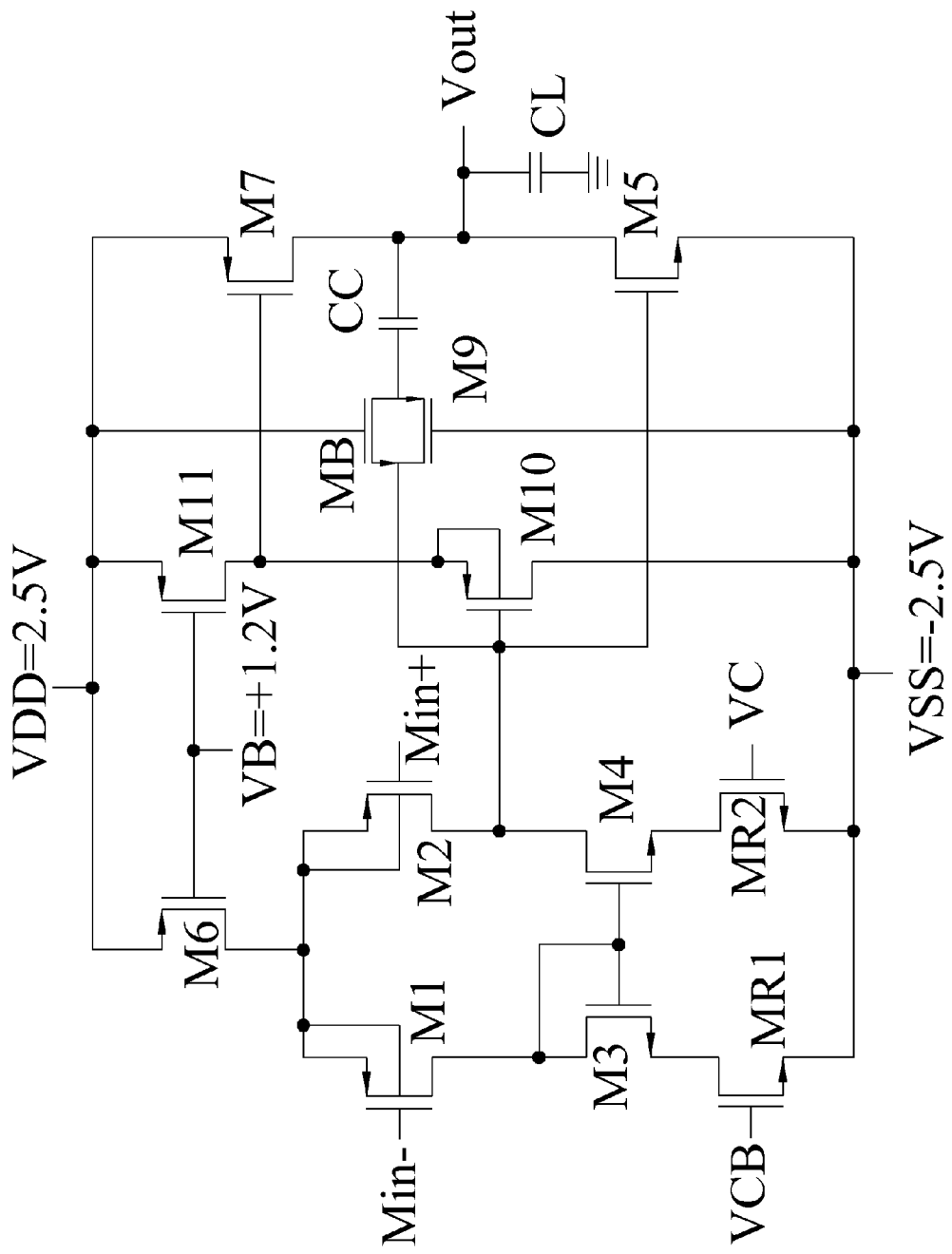
FIG. 1 is a circuit diagram of a conventional automatic offset compensation scheme with ping-pong control for CMOS operational amplifier.

The present invention will now be described with some preferred embodiments thereof and with reference to the accompanying drawings. For the purpose of easy to understand, elements that are the same in the preferred embodiments are denoted by the same reference numerals.

Figure 2:
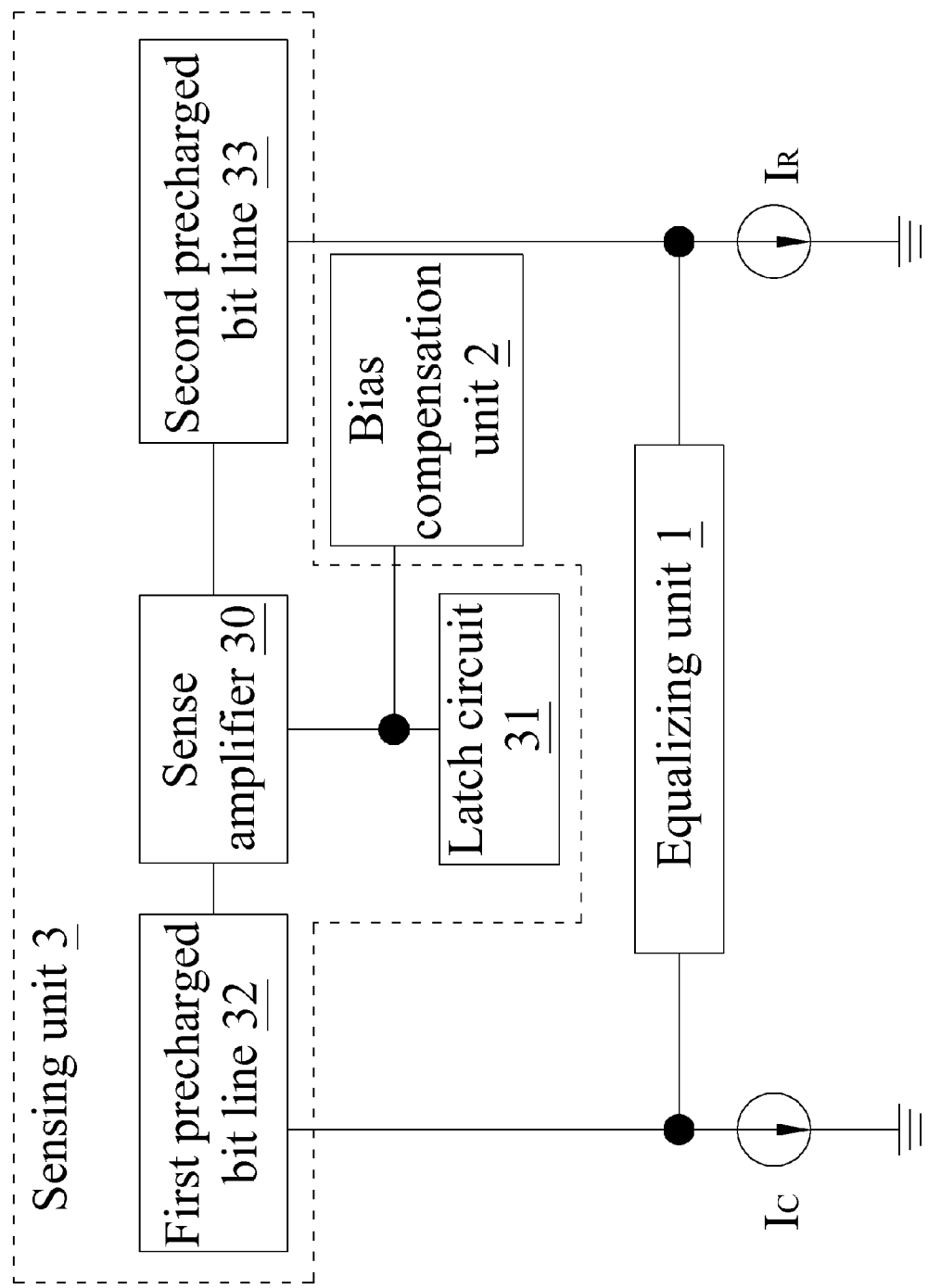
FIG. 2 is a block diagram of a current-sense amplifier with low-offset adjustment according to an embodiment of the present invention.

Please refer to FIG. 2 that is a block diagram of a current-sense amplifier with low-offset adjustment according to an embodiment of the present invention. As shown, the current-sense amplifier with low-offset adjustment includes an equalizing unit 1, a bias compensation unit 2, and a sensing unit 3. The sensing unit 3 includes a sense amplifier 30, a latch circuit 31, a first precharged bit line 32, and a second precharged bit line 33. The first precharged bit line 32 is coupled to a cell current source $I_C$ and is electrically connected to the sense amplifier 30 to generate a first current $In_1$. The second precharged bit line 33 is coupled to a reference current source $I_R$ and is electrically connected to the sense amplifier 30 to generate a second current $In_2$.

The equalizing unit 1 is electrically connected to the first precharged bit line 32 and the second precharged bit line 33. The equalizing unit 1 is coupled at one of two opposite ends to the cell current source $I_C$ and at the other end to the reference current source $I_R$. The equalizing unit 1 is able to regulate a voltage of the first precharged bit line 32 and a voltage of the second precharged bit line 33 to the same electric potential. Wherein, the cell current source $I_C$ is electrically connected at an end to the first precharged bit line 32 and the equalizing unit 1, and at another end to ground; and the reference current source $I_R$ is electrically connected at an end to the second precharged bit line 33 and the equalizing unit 1, and at another end to ground.

The sense amplifier 30 is electrically connected to the latch circuit 31 and the bias compensation unit 2, so that the bias compensation unit 2 can output a compensation voltage to the sense amplifier 30 and the latch circuit 31 for adjusting and compensating an offset voltage of the current-sense amplifier.

Figure 3:
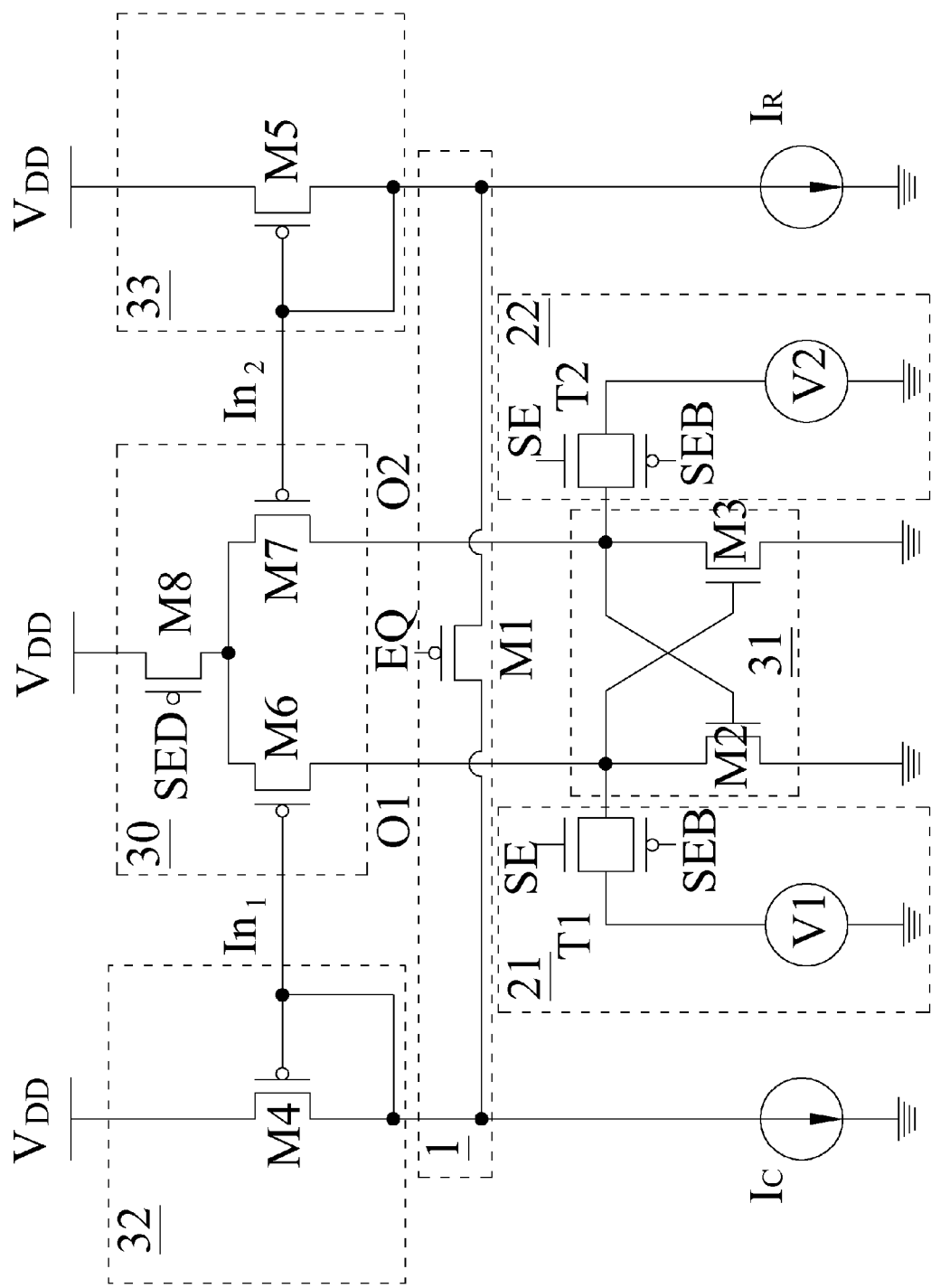
FIG. 3 is a circuit diagram of the current-sense amplifier with low-offset adjustment according to an embodiment of the present invention.

Please refer to FIG. 3 that is a circuit diagram of the current-sense amplifier with low-offset adjustment according to an embodiment of the present invention. As shown, the current-sense amplifier with low-offset adjustment includes an equalizing unit 1, a first compensation circuit 21, a second compensation circuit 22, a sense amplifier 30, a latch circuit 31, a first precharged bit line 32, a second precharged bit line 33, a cell current source $I_C$, and a reference current source $I_R$.

The equalizing unit 1 has a first transistor M1, which is a p-type metal-oxide-semiconductor field-effect transistor (MOSFET) and is briefly referred to as a PMOS herein; the latch circuit 31 has a second transistor M2, which is an n-type MOSFET and is briefly referred to as an NMOS herein, and a third transistor M3, which is also an NMOS; the first precharged bit line 32 has a fourth transistor M4, which is a PMOS; the second precharged bit line 33 has a fifth transistor M5, which is a PMOS; and the sense amplifier 30 has a sixth transistor M6, which is a PMOS, a seventh transistor M7, which is a PMOS, and an eighth transistor M8, which is a PMOS. Further, the first compensation circuit 21 has a first transmission gate T1 and a first voltage source V1; and the second compensation circuit 22 has a second transmission gate T2 and a second voltage source V2.

The fourth transistor M4 has a source connected to $V_{DD}$, and a drain coupled to a drain of the first transistor M1 and an end of the cell current source $I_C$, while another end of the cell current source $I_C$ is connected to ground. The fourth transistor M4 has a gate coupled to a gate of the sixth transistor M6 to generate a first current $In_1$; and the drain of the fourth transistor M4 can be coupled to the gate thereof to form a short circuit. The fifth transistor M5 has a source connected to $V_{DD}$, and a drain coupled to a source of the first transistor M1 and to an end of the reference current source $I_R$, while another end of the reference current source $I_R$ is connected to ground. The fifth transistor M5 has a gate coupled to a gate of the seventh transistor M7 to generate a second current $In_2$; and the drain of the fifth transistor M5 can be coupled to the gate thereof to form a short circuit. Further, the first transistor M1 has a gate, at where an EQ signal is input for controlling the first transistor M1 to turn on or cut off.

The eighth transistor M8 has a source connected to $V_{DD}$, a gate inputting an SED signal for controlling the eighth transistor M8 to turn on or cut off, and a drain coupled to a source of the sixth transistor M6 and a source of the seventh transistor M7. The second transistor M2 has a drain coupled to a drain of the sixth transistor M6 and an output of the first transmission gate T1; and the drain of the sixth transistor M6 outputs a first signal of sense amplifier 30 and is deemed as a first output $O_1$ of the sense amplifier 30. The second transistor M2 has a gate coupled to a drain of the third transistor M3 and an output of the second transmission gate T2, and has a source connected to ground. The drain of the third transistor M3 is coupled to a drain of the seventh transistor M7 and the output of the second transmission gate T2; and the drain of the seventh transistor M7 outputs a second signal of the sense amplifier 30 and is deemed as second output $O_2$ of the sense amplifier 30. The third transistor M3 has a gate coupled to the drain of the second transistor M2 and the output of the first transmission gate T1, and a source connected to ground.

The first voltage source V1 is coupled at one of two opposite ends to an input of the first transmission gate T1, and connected at the other end to ground. The second voltage source V2 is coupled at one of two opposite ends to an input of the second transmission gate T2, and connected at the other end to ground. The first and the second transmission gate T1, T2 are both controlled by an SE signal and an SEB signal to turn on or cut off.

Figure 4:
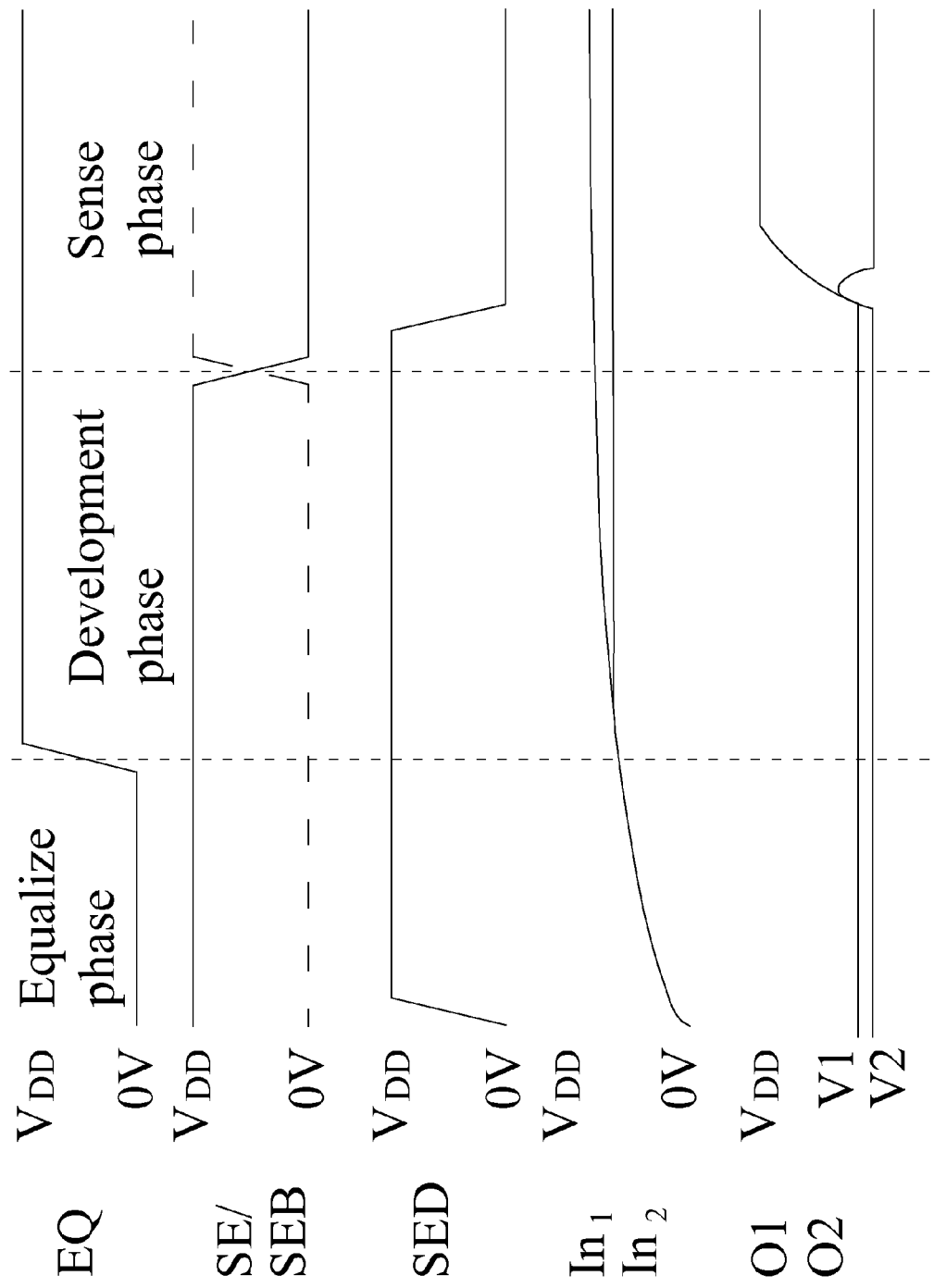
FIG. 4 is a time-domain graph of the current-sense amplifier with low-offset adjustment according to an embodiment of the present invention.

Please refer to FIG. 4 that is a time-domain graph of the current-sense amplifier with low-offset adjustment according to an embodiment of the present invention. When the EQ signal is low and the SED signal is high, the current-sense amplifier is in an equalize phase, the first transistor M1 is turned on to pull the first current $In_1$ and the second current $In_2$ to the same potential, so as to reduce the clock-skew sensitivity of the current-sense amplifier and enable increased memory data read speed. At this point, the first transmission gate T1 outputs the first voltage source V1 to the first output $O_1$, and the second transmission gate T2 outputs the second voltage source V2 to the second output $O_2$. Since the eighth transistor M8 is cut off, no current will flow to the first output $O_1$ and the second output $O_2$; and since the first voltage source V1 and the second voltage source V2 are smaller than a threshold voltage of the fourth transistor M4 and of the fifth transistor M5, respectively, the fourth and the fifth transistor M4, M5 would not be brought to turn on, and the first and the second voltage source V1, V2 are present at the first and the second output $O_1$, $O_2$, respectively.

However, since the first and the second voltage source V1, V2 have voltage values determined according to the offset voltage of the current-sense amplifier, the first voltage source V1 and the second voltage source V2 are not necessarily the same in electric potential thereof. A main purpose of the voltage difference between the first and the second voltage source V1, V2 is to compensate the offset voltage, so that the offset voltage is reduced and approaches to an ideal value of 0V.

At the end of the equalize phase, the current-sense amplifier goes into a development phase. At this point, the EQ signal changes from low to high, the first transistor M1 is cut off, the first current $In_1$ and the second current $In_2$ generate different voltages due to different current values of the cell current source $I_C$ and the reference current source $I_R$. Then, the current-sense amplifier goes into a sense phase, in which the first transmission gate T1 and the second transmission gate T2 are cut off, the EQ signal keeps at high, the SED signal changes from high to low, the eighth transistor M8 is turned on, and the first output $O_1$ and the second output $O_2$ produce electric potentials. When the voltages reach the threshold voltages of the fourth transistor M4 and the fifth transistor M5, respectively, the fourth and the fifth transistor M4, M5 will be turned on, and the potential at one of the first output $O_1$ and the second output $O_2$ will be pulled to ground. From the first output $O_1$ and the second output $O_2$, it is able to know the digital data read out by the memory is 0 or 1.

Please note, while MOSFETs are used as circuit elements in the illustrated embodiment of the present invention, it is obvious to one of ordinary skill in the art these circuit elements can be otherwise bipolar transistors or combinations of bipolar transistors and field-effect transistors without departing from the spirit and the scope of the present invention. It is understood the above embodiment is illustrated only as an exemplary and is not intended to limit the present invention in any way.

Figure 5:
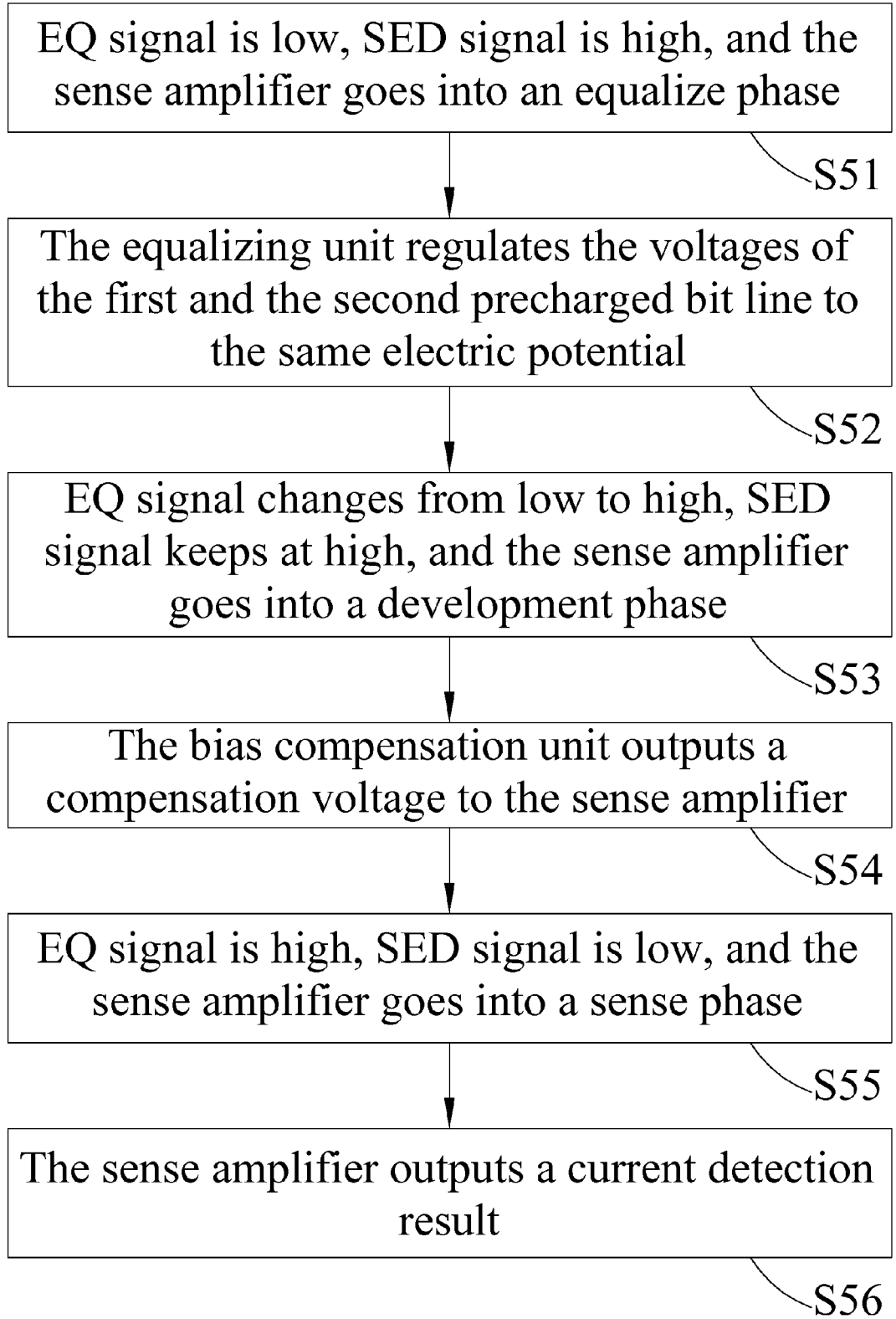
FIG. 5 is a flowchart showing the steps included in a low-offset adjustment method according to the present invention.

FIG. 5 is a flowchart showing the steps included in a low-offset adjustment method according to the present invention. As shown, the low-offset adjustment method is applicable to the compensation of the offset voltage of the above-described current-sense amplifier. The current-sense amplifier includes a sensing unit, an equalizing unit, and a bias compensation unit; and the sensing unit further includes a sense amplifier, a latch circuit, a first precharged bit line, and a second precharged bit line. The low-offset adjustment method includes the following steps:

S51: when the EQ signal is low and the SED signal is high, the first transistor of the equalizing unit is turned on while the eighth transistor of the sense amplifier is cut off, and the sense amplifier goes into an equalize phase;

S52: in the equalize phase, the equalizing unit regulates the voltages of the first and the second precharged bit line to the same electric potential;

S53: when the EQ signal changes from low to high while the SED signal keeps at high, the first transistor of the equalizing unit is cut off while the eighth transistor of the sense amplifier is turned on, and the sense amplifier goes into a development phase;

S54: in the development phase, the bias compensation unit outputs a compensation voltage to the sense amplifier to compensate an offset voltage of the sense amplifier;

S55: when the EQ signal keeps at high, the SED signal changes from high to low, and a transmission gate of the compensation unit is cut off, the sense amplifier goes into a sense phase; and S56: in the sense phase, the sense amplifier outputs a current detection result.

Since the details and the implementation of the low-offset adjustment method have also been recited in the previous description of the structure of the current-sense amplifier with low-offset adjustment according to the present invention, they are not repeated herein.

In conclusion, in the current-sense amplifier with low-offset adjustment according to the present invention and the low-offset adjustment method thereof, the equalizing unit reduces the input offset voltage of the current-sense amplifier to enable increased current detection accuracy and accordingly, increased memory data read speed. Further, the compensation circuit supplies compensation voltage to reduce the offset voltage of the current-sense amplifier to ensure good current detection quality and increased memory data read accuracy.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A current-sense amplifier with low-offset adjustment, comprising:
    a sensing unit including a sense amplifier, a latch circuit, a first precharged bit line, and a second precharged bit line;
    an equalizing unit being electrically connected to the first precharged bit line and the second precharged bit line for regulating voltages of the first and the second precharged bit line to a same electric potential; and
    a bias compensation unit being electrically connected to the sense amplifier for compensating an input offset voltage of the sense amplifier.

2. The current-sense amplifier with low-offset adjustment as claimed in claim 1, wherein the equalizing unit further includes a first transistor; the first transistor being coupled at a drain to the first precharged bit line, and at a source to the second precharged bit line; whereby when the first transistor is turned on, the equalizing unit regulates voltages of the first and the second precharged bit line to the same electric potential.

3. The current-sense amplifier with low-offset adjustment as claimed in claim 1, wherein the sense amplifier further includes a first output and a second output for outputting a first sensing signal and a second sensing signal, respectively.

4. The current-sense amplifier with low-offset adjustment as claimed in claim 1, wherein the bias compensation unit further includes a first and a second compensation circuit being electrically connected to the first and the second output, respectively.

5. The current-sense amplifier with low-offset adjustment as claimed in claim 4, wherein the first compensation circuit further includes:
    a first voltage source supplying a first compensation voltage; and
    a first transmission gate being coupled at an end to the first voltage source and at another end to the first output; whereby when the first transmission gate is turned on, the first transmission gate outputs the first compensation voltage to the first output; and
    wherein the second compensation circuit further includes:
    a second voltage source for supplying a second compensation voltage; and a second transmission gate being coupled at an end to the second voltage source and at another end to the second output; whereby when the second transmission gate is turned on, the second transmission gate outputs the second compensation voltage to the second output.

6. The current-sense amplifier with low-offset adjustment as claimed in claim 5, wherein the first voltage source and the second voltage source respectively supply a stable voltage to compensate the input offset voltage of the sense amplifier.

7. The current-sense amplifier with low-offset adjustment as claimed in claim 4, wherein the first compensation circuit and the second compensation circuit are further electrically connected to the latch circuit, and the latch circuit includes a second transistor and a third transistor;

the second transistor being coupled at a gate to a drain of the third transistor and the second compensation circuit for receiving the second compensation voltage output by the second compensation circuit; and the second transistor being further coupled at the gate to the second output for receiving the second sensing signal output by the sense amplifier; and the third transistor being coupled at a gate to a drain of the second transistor and the first compensation circuit for receiving the first compensation voltage output by the first compensation circuit; and the third transistor being further coupled at the gate to the first output for receiving the first sensing signal output by the sense amplifier.

8. The current-sense amplifier with low-offset adjustment as claimed in claim 7, wherein the voltage output by the first compensation circuit and the voltage output by the second compensation circuit are smaller than a first threshold voltage of the third transistor and a second threshold voltage of the second transistor, respectively.

9. A low-offset adjustment method for compensating an offset voltage of a current-sense amplifier; the current-sense amplifier including a sensing unit, an equalizing unit and a bias compensation unit; and the sensing unit including a sense amplifier, a latch circuit, a first precharged bit line and a second precharged bit line; the method comprising the following steps:

regulating a voltage of the first precharged bit line and a voltage of the second precharged bit line to a same electric potential by the equalizing unit; and outputting a compensation voltage to the sense amplifier to compensate an input offset voltage of the sense amplifier by the bias compensation unit.

10. The low-offset adjustment method as claimed in claim 9, further comprising the following step:

regulating the voltage of the first precharged bit line and the voltage of the second precharged bit line to the same electric potential by the equalizing unit when a first transistor of the equalizing unit is turned on.

11. The low-offset adjustment method as claimed in claim 9, further comprising the following step:

respectively outputting a first compensation voltage and a second compensation voltage by a first compensation circuit and a second compensation circuit of the bias compensation unit, for compensating the input offset voltage of the sense amplifier.

12. The low-offset adjustment method as claimed in claim 11, further comprising the following steps:

outputting the first compensation voltage to the sense amplifier by the first compensation circuit for compensating the input offset voltage of the sense amplifier when a first transmission gate of the first compensation circuit is turned on; and outputting the second compensation voltage to the sense amplifier by the second compensation circuit for compensating the input offset voltage of the sense amplifier when a second transmission gate of the second compensation circuit is turned on.

13. The low-offset adjustment method as claimed in claim 12, wherein the first and the second compensation voltage are stable voltages for compensating the input offset voltage of the sense amplifier.

14. The low-offset adjustment method as claimed in claim 11, further comprising the following steps:

receiving a first sensing signal output by the sense amplifier and the first compensation voltage output by the first compensation circuit by the third transistor when a third transistor of the latch circuit is turned on;

temporarily storing the first sensing signal in the latch circuit;

receiving a second sensing signal output by the sense amplifier and the second compensation voltage output by the second compensation circuit by the second transistor when a second transistor of the latch circuit is turned on; and temporarily storing the second sensing signal in the latch circuit.

15. The low-offset adjustment method as claimed in claim 14, wherein the voltage output by the first compensation circuit and the voltage output by the second compensation circuit are smaller than a first threshold voltage of the third transistor and a second threshold voltage of the second transistor, respectively.

* * * * *